(12) United States Patent
Cheong et al.

(10) Patent No.: US 10,142,636 B2
(45) Date of Patent: Nov. 27, 2018

(54) COMMUNICATION SYSTEM WITH CODING MECHANISM AND METHOD OF OPERATION THEREOF

(71) Applicant: Sony Corporation, Tokyo (JP)

(72) Inventors: Hye-Yeon Cheong, Los Gatos, CA (US); Ali Tabatabai, Cupertino, CA (US)

(73) Assignee: SONY CORPORATION, Tokyo (JP)

( * ) Notice: Subject to any disclaimer, the term of this patent is extended or adjusted under 35 U.S.C. 154(b) by 219 days.

(21) Appl. No.: 14/300,145

(22) Filed: Jun. 9, 2014

(65) Prior Publication Data

US 2015/0358624 A1 Dec. 10, 2015

(51) Int. Cl.
*H04N 19/176* (2014.01)
*H04N 19/91* (2014.01)
*H03M 7/40* (2006.01)

(52) U.S. Cl.
CPC ........ *H04N 19/176* (2014.11); *H03M 7/4075* (2013.01); *H04N 19/91* (2014.11)

(58) Field of Classification Search
CPC .... H04N 19/176; H04N 19/91; H03M 7/4075
See application file for complete search history.

(56) References Cited

U.S. PATENT DOCUMENTS

| | | | |
|---|---|---|---|
| 6,665,444 B1 * | 12/2003 | Kajiwara | G06T 9/007 375/E7.045 |
| 7,486,211 B2 | 2/2009 | Lin et al. | |
| 8,401,082 B2 | 3/2013 | Ye et al. | |
| 2010/0177822 A1 * | 7/2010 | Karczewicz | H04N 19/46 375/240.12 |
| 2012/0027077 A1 * | 2/2012 | Reznik | H03M 7/40 375/240.2 |
| 2013/0027230 A1 | 1/2013 | Marpe et al. | |
| 2013/0114709 A1 * | 5/2013 | Shima | H04N 19/176 375/240.12 |
| 2013/0170748 A1 * | 7/2013 | Thyagarajan | G06T 9/007 382/166 |
| 2013/0182757 A1 * | 7/2013 | Karczewicz | H04N 19/70 375/240.02 |

(Continued)

FOREIGN PATENT DOCUMENTS

| | | |
|---|---|---|
| JP | 2001045482 A | 2/2001 |
| JP | 2005210584 A | 8/2005 |
| JP | 2007251834 A | 9/2007 |

(Continued)

OTHER PUBLICATIONS

Chandra et al. ("Test data compression for system-on-a-chip using Golomb codes," Proceedings 18th IEEE VLSI Test Symposium, Montreal, Que., 2000, pp. 113-120.).*

(Continued)

*Primary Examiner* — Maria E Vazquez Colon
(74) *Attorney, Agent, or Firm* — Haverstock & Owens LLP

(57) ABSTRACT

A communication system and the method of operation thereof includes: a block size unit for receiving an input digital data stream; a progressive-Golomb encoder, coupled to the block size unit, for encoding a progressive-Golomb codeword from the input digital data stream; and a transmitter unit, coupled to the progressive-Golomb encoder for transferring the progressive-Golomb codeword to an output device.

20 Claims, 3 Drawing Sheets

(56) References Cited

U.S. PATENT DOCUMENTS

2014/0015698 A1    1/2014  Shoa Hassani Lashdan
2015/0201220 A1*   7/2015  Cheong .................. H04N 19/91
                                                        375/240.23

FOREIGN PATENT DOCUMENTS

JP    2011526747 A    10/2011
WO    2013159119 A1   10/2013

OTHER PUBLICATIONS

Wikipedia: "Golomb Coding", Internet article, May 24, 2014 (May 25, 2014), XP002774622, Retrieved from the Internet: URL:https://en.wikipedia.org/w/index.php?title=Golmob_coding&oldid=610111695 [retrieved on Oct. 12, 2017].
H.S. Malvar: "Adaptive Run-Length / Golomb-Rice Encoding of Quantized Generalized Gaussian Sources With Unknown Statistics", Data Compression Confernece (DDC'06), Jan. 1, 2006 (Jan. 1, 2006), pp. 23-32, XP055168375, DOI: 10.1109/DDC.2006.5 ISBN: 978-0-76-952545-7 * the whole document*.
Extended European Search Report from EP Application No. 15806439.4 dated Oct. 25, 2017.
Official Action from Japanese Patent Application No. JP2016-572559 dated Feb. 7, 2018.

\* cited by examiner

COMMUNICATION SYSTEM WITH CODING MECHANISM AND METHOD OF OPERATION THEREOF

TECHNICAL FIELD

The present invention relates generally to a communication system, and more particularly to a system for applying variable length coding to communication data.

BACKGROUND ART

Video compression standards use a variety of techniques to compress video data. The techniques include both lossy and lossless compression. The lossy compression takes advantage of spatial and temporal redundancies in the video data. Many compression techniques available offer significant levels of compression, but result in a degradation of the quality of the video signal. Typically, techniques for transferring compressed information require the compressed information to be transferred at a constant bit rate.

One compression technique capable of offering significant levels of compression while preserving the desired level of quality for video signals utilizes adaptively sized blocks and sub-blocks of encoded Discrete Cosine Transform (DCT) coefficient data. While the DCT encoding can provide good compression, it does produce edge effects in video streams of objects in motion.

The lossless compression includes variable length coding, including exponential-Golomb codes. During decoding, the foregoing compressions are reversed. Part of decoding the variable length codes includes converting unsigned exponential-Golomb codes to signed-Golomb codes. Decoding video data is preferably done in real time. This requires large numbers of computations to be performed in a short amount of time.

Thus, a need still remains for a communication system that can provide position registration without the position error induced by the manual positioning of markers. In view of the increased popularity of high definition video and audio communication, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a communication system including: receiving an input digital data stream by a block size unit; encoding a progressive-Golomb codeword from the input digital data stream; and transferring, to an output device, the progressive-Golomb codeword.

The present invention provides a communication system, including: a block size unit for receiving an input digital data stream; a progressive-Golomb encoder, coupled to the block size unit, for encoding a progressive-Golomb codeword from the input digital data stream; and a transmitter unit, coupled to the progressive-Golomb encoder for transferring the progressive-Golomb codeword to an output device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
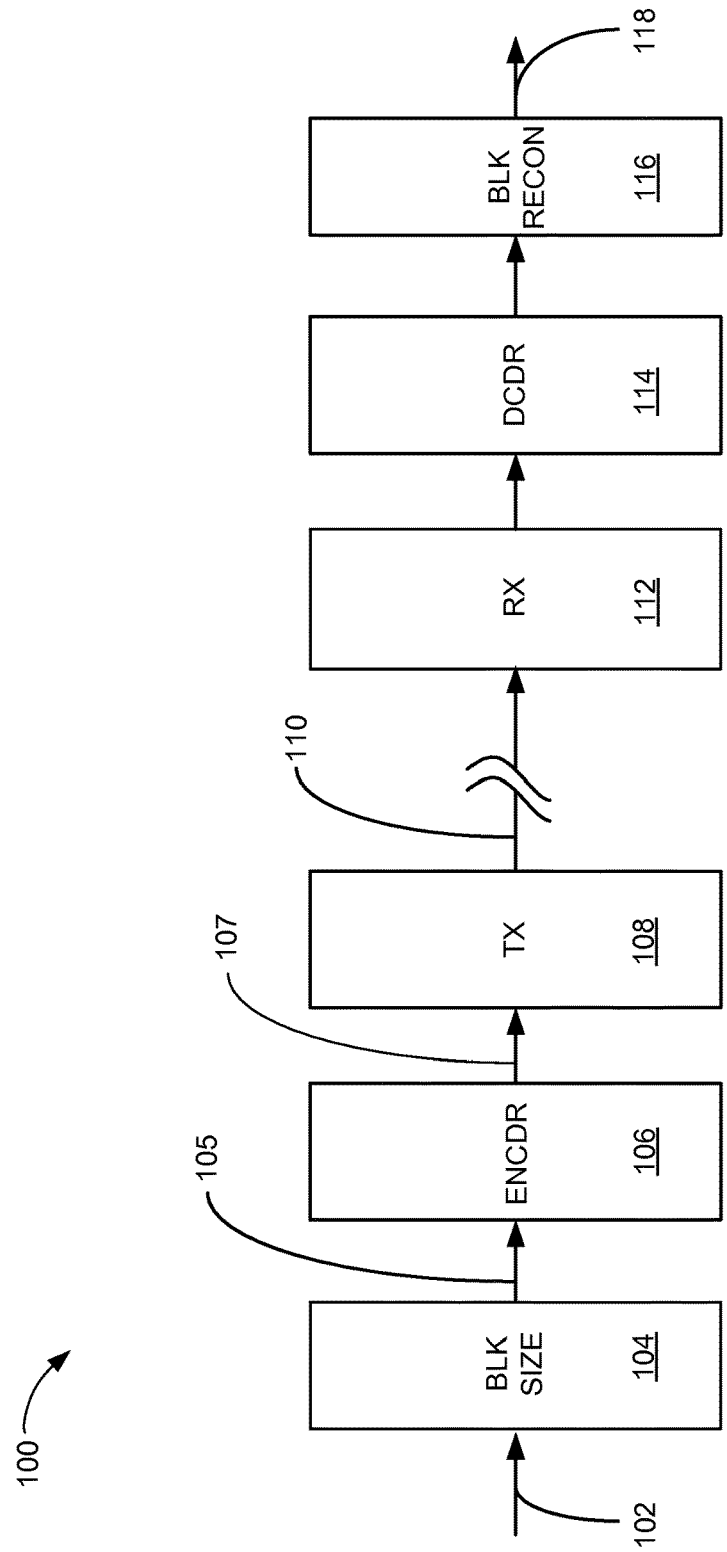
FIG. 1 is a functional block diagram of a communication system with coding mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals.

The term "module" referred to herein can include software, hardware, or a combination thereof in an embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof.

The term "unit" referred to herein means a hardware device, such as an application specific integrated circuit, combinational logic, core logic, or a dedicated processor.

Referring now to FIG. 1, therein is shown a functional block diagram of a communication system 100 with coding mechanism in an embodiment of the present invention. The functional block diagram of the communication system 100 depicts an input digital data stream 102, such as a pixel stream, a video data stream, an audio stream, or a combination thereof, coupled to a block size unit 104. The block size unit 104 can monitor the input digital input stream 102 in order to determine a block size for the current segment of the input digital data stream 102. The block size unit 104 can analyze the input digital data stream 102 for determining a block boundary 105 by detecting the number of ones before a zero, or the number of zeroes before a one that are present in the input digital data stream 102.

The block size unit 104 can pass the bit stream and a block indicator to a progressive-Golomb encoder 106, such as a hardware mathematics array, for encoding and compression of the input digital data stream 102. The progressive-Golomb encoder 106 can minimize a bit length of the average value of a progressive-Golomb codeword 107. The progressive-Golomb encoder 106 can support higher bandwidth than prior art solutions that might use Golomb-Rice coding for example because the group size of the progressive-Golomb encoder 106 can be parameterized to match the distribution of the input digital data stream 102. Unlike the Golomb-Rice coding, which requires the group size to be a power of 2 (1, 2, 4, 8, 16, 32, 64, etc.), the progressive-Golomb encoder 106 can have other group sizes.

The progressive-Golomb codeword 107 can be coupled to a transmitter unit 108, which can transfer the progressive-Golomb codeword 107 to an output device 110. The output device 110 can be hardware, such as a wired or wireless transmission channel, or hard media, such as a compact disc, a digital video disc, or a non-volatile memory device.

The progressive-Golomb codeword 107 can be conveyed to a receiver module 112, through the output device 110, which can transform the output device 110 back into the code words 107. The receiver module 112 can be coupled to a progressive-Golomb decoder 114, such as a hardware mathematics array, to convey the progressive-Golomb codeword 107. The progressive-Golomb decoder 114 can reverse the operations of the progressive-Golomb encoder 106 without reducing any quality from the input digital data stream 102.

The progressive-Golomb decoder 114 can be coupled to the block reconstruction module 116 for reconstructing the block boundary 105 for assembling a delivered digital data stream 118. The complete transfer from the input digital data stream 102 to the delivered digital data stream 118 is performed with no loss in the quality of the signal.

It has been discovered that the communication system 100 can parameterize the group size of the coding structure in order to minimize the average bit length of the progressive-Golomb codeword 107. The communication system 100 can compress video or audio streams with equal efficiency. The group sizes can be preselected and fixed on an application basis or they can be dynamically adjusted to match the input data stream.

Figure 2:
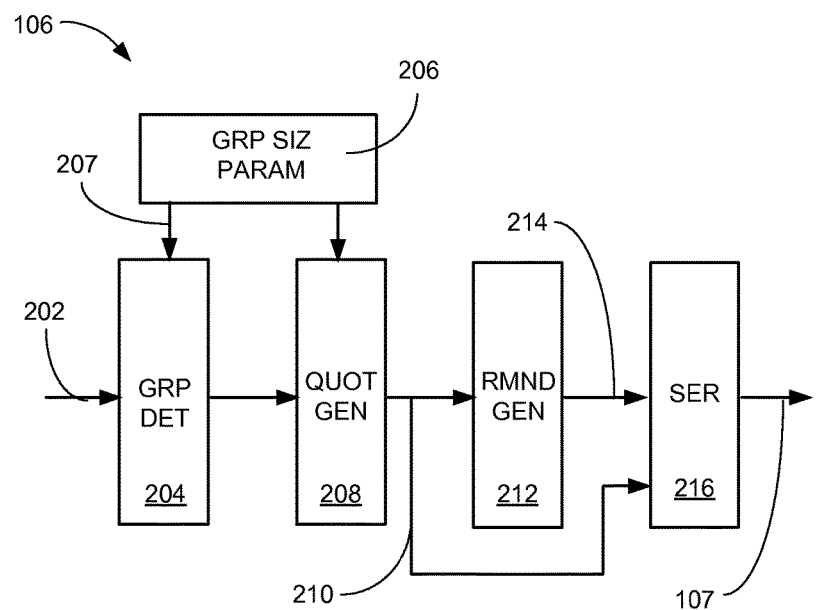
FIG. 2 is a functional block diagram of the progressive-Golomb encoder in an embodiment of the present invention.

Referring now to FIG. 2, therein is shown a functional block diagram of the progressive-Golomb encoder 106 in an embodiment of the present invention. The functional block diagram of the progressive-Golomb encoder 106 depicts an input digital stream 202 input to a group detector module 204. The group detector module 204 can scan the input digital stream 202 to determine which group will perform the coding of the input digital stream 202. A group size parameter module 206 can provide a group size parameter 207 for matching the characteristics of the input digital stream 202. The group size parameter 207 can provide either fixed boundaries or dynamically adjustable group sizes that are not required to be on powers of 2 boundaries, such as 1, 2, 4, 8, 16, etc., as required by Golomb-Rice coding.

By way of an example, an embodiment of the group detector module 204 can identify one of four groups having sizes of 3, 4, 12, and infinite as provided by the group detector module 204. The first group having a size of 3 can use unary coding with a divisor of m=1. The second group having the size of 4 can implement a Golomb-2 code with a divisor of m=2. The third group having a size of 12 can implement a Golomb-4 code with a divisor of m=4. The fourth group having an infinite size can implement a Golomb-8 code with a divisor of m=8. The selection of the four groups having sizes of 3, 4, 12, and infinite can be optimized for the input digital stream 202 having a Gaussian distribution with a single peak value. Other distributions of the input digital stream 202 can be represented by different group sizes.

The group detector module 204 can be coupled to a quotient generator module 208 for generating a quotient portion 210 by dividing the input digital stream 202 by the value of m associated with the group identified by the group detector module 204. The communication between the group detector module 204 and the quotient generator module 208 can include a group identifier and the digital stream. The group size parameter module 206 can be coupled to the quotient generator module 208 for aiding the generation of the quotient portion 210 when a dynamic adjustment process is implemented in the group size parameter module 206.

TABLE 1 an example of the Progressive-Golomb coding

| x | Prog-Golomb | | |
|---|---|---|---|
| 0 | 0 | } | $m = 2^0 = 1$ |
| −1 | 10 | | Unary |
| 1 | 110 | | Group size = 3 |
| −2 | 1110-0 | } | |
| 2 | 1110-1 | | $m = 2^1 = 2$ |
| −3 | 11110-0 | | Golomb-2 |
| 3 | 11110-1 | | Group size = 4 |
| −4 | 111110-00 | } | |
| 4 | 111110-01 | | |
| −5 | 111110-10 | | |
| 5 | 111110-11 | | |
| −6 | 1111110-00 | | $m = 2^2 = 4$ |
| 6 | 1111110-01 | | Golomb-4 |
| −7 | 1111110-10 | | Group size = 12 |
| 7 | 1111110-11 | | |
| −8 | 11111110-00 | | |
| 8 | 11111110-01 | | |
| −9 | 11111110-10 | | |
| 9 | 11111110-11 | | |
| −10 | 111111110-000 | } | $m = 2^3 = 8$ |
| . | . | | Golomb-8 |
| . | . | | Group size = inf |
| . | . | | |

The quotient generator module 208 can be coupled to a remainder generator module 212 for determining a residual unary count from the input digital stream 202 after the quotient portion 210 has been removed. The remainder generator module 212 can calculate a remainder portion 214. Both the quotient portion 210 and the remainder portion 214 are coupled to a serializer module 216. The serializer module 216 can concatenate the quotient portion 210 and the remainder portion 214 for forming the progressive-Golomb codeword 107, such as a minimum bit-length unary string.

As can be seen from Table 1, the group size can be any positive integer without limiting the sizes to powers of 2. In the example of Table 1, the quotient portion 210 and the remainder portion 214 are separated by a hyphen for clarity only. The resultant progressive-Golomb codeword 107 can have a shorter bit-length unary string than other variable length coding methods, such as the Golomb-Rice coding method or the Golomb-M coding method.

Figure 3:
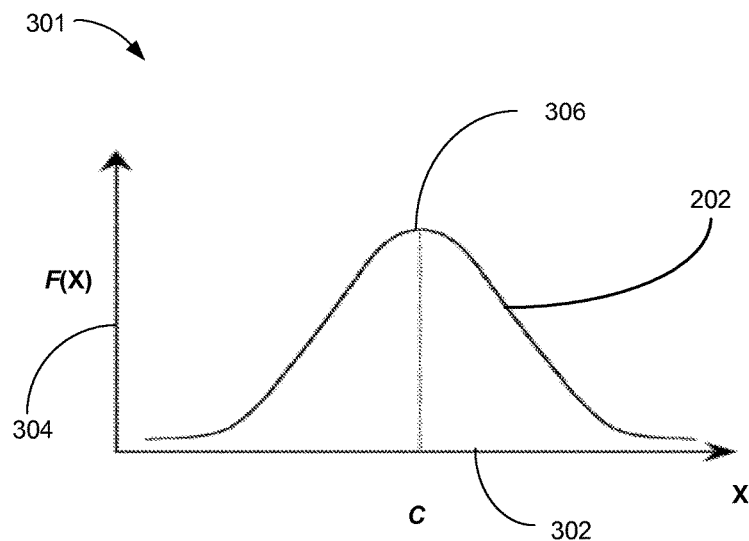
FIG. 3 is a line graph of an example of an input digital stream.

Referring now to FIG. 3, therein is shown a line graph 301 of an example of an input digital stream 202. The line graph 301 of the example of the input digital stream 202 depicts a horizontal axis 302 representing the value X of the input digital stream 202 and a vertical axis 304 representing the value of F(X) as it relates to the input digital stream 202. A mode mean 306 can be indicated by the C positioned on the horizontal axis 302.

By way of an example, the group detector module 204 of FIG. 2 can use the following equations to determine with which group the sample should be coded. The chosen group sizes are the same as the example above (3, 4, 12, infinity).

If $|X-C|\le 1$ then select group 1 (Unary code);

Elseif $|X-C|\le 3$ then select group 2 (Golomb-2 code); (EQ 1)

Elseif $|X-C|\le 9$ then select group 3 (Golomb-4 code);

Else select group 4 (Golomb-8 code)

As can be seen from the data in Table 1, this coding scheme has a negative bias because the negative non-zero values come first in the list. This bias can also be parameterized with by the group size parameter module 206 of FIG. 2 in order to minimize the bit-length of the progressive-Golomb codeword 107 of FIG. 1 and match the characteristic of the input digital stream 202.

Figure 4:
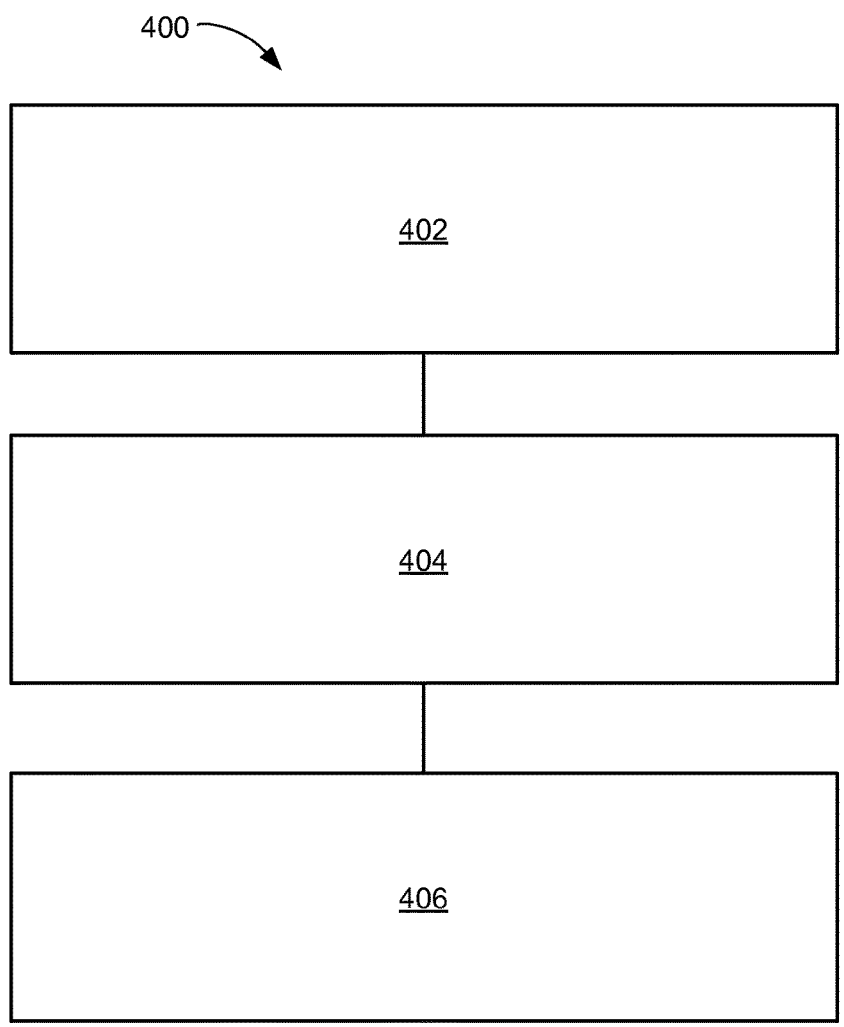
FIG. 4 is a flow chart of a method of operation of a communication system in a further embodiment of the present invention.

Referring now to FIG. 4, therein is shown a flow chart of a method 400 of operation of a communication system 100 in a further embodiment of the present invention. The method 400 includes: receiving an input digital data stream by a block size unit in a block 402; encoding a progressive-Golomb codeword from the input digital data stream in a block 404; and transferring, to an output device, the progressive-Golomb codeword in a block 406.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a communication system comprising:
   receiving an input digital data stream by a block size unit;
   storing at least three group sizes from which to select, wherein the at least three group sizes include a first group size of three, a second group size of four and a third group size of infinite;
   encoding a progressive-Golomb codeword from the input digital data stream, including parameterizing a group size to match a distribution of the input digital data stream, wherein the group size is selected from the at least three group sizes; and
   transferring, to an output device, the progressive-Golomb codeword.

2. The method as claimed in claim 1 wherein receiving the input digital data stream includes receiving a video data stream.

3. The method as claimed in claim 1 further comprising determining a block size from the input digital data stream.

4. The method as claimed in claim 1 further comprising assembling a delivered digital data stream by decoding the progressive-Golomb codeword.

5. The method as claimed in claim 1 wherein transferring to the output device includes transferring on a transmission channel.

6. A method of operation of a communication system comprising:
   receiving an input digital data stream by a block size unit;
   storing at least three group sizes from which to select, wherein the at least three group sizes include a first group size of three, a second group size of four and a third group size of infinite;
   encoding a progressive-Golomb codeword from the input digital data stream including establishing a group size parameter for matching the input digital data stream, wherein a group size includes a power of two and additional sizes that are not a power of two, wherein the group size is selected from the at least three group sizes; and
   transferring, to an output device, the progressive-Golomb codeword.

7. The method as claimed in claim 6 wherein receiving the input digital data stream includes receiving a video data stream, an audio data stream, or a combination thereof.

8. The method as claimed in claim 6 further comprising determining a block size from the input digital data stream includes determining a block boundary by analyzing the input digital data stream.

9. The method as claimed in claim 6 further comprising assembling a delivered digital data stream by decoding the progressive-Golomb codeword including reconstructing a block boundary from the progressive-Golomb codeword.

10. The method as claimed in claim 6 wherein transferring to the output device includes transferring on a wired or wireless transmission channel, a compact disc, or a digital video disc.

11. A communication system comprising:
    a block size hardware for receiving an input digital data stream;
    a memory for storing at least three group sizes from which to select, wherein the at least three group sizes include a first group size of three, a second group size of four and a third group size of infinite;
    a progressive-Golomb encoder, coupled to the block size hardware, for encoding a progressive-Golomb codeword from the input digital data stream, including parameterizing a group size to match a distribution of the input digital data stream, wherein the group size includes a power of two and additional sizes that are not a power of two, wherein the group size is selected from the at least three group sizes; and a transmitter hardware, coupled to the progressive-Golomb encoder for transferring the progressive-Golomb codeword to an output device.

12. The system as claimed in claim 11 wherein the block size hardware for receiving the input digital data stream includes the block size hardware coupled to a digital video stream.

13. The system as claimed in claim 11 wherein the block size hardware is configured to generate a block boundary, and the block size hardware is coupled to the progressive-Golomb encoder.

14. The system as claimed in claim 11 further comprising a block reconstruction hardware module configured to assemble a delivered digital data stream from the progressive-Golomb codeword.

15. The system as claimed in claim 11 further comprising an output media coupled to the transmitter hardware.

16. The system as claimed in claim 11 wherein the progressive-Golomb encoder includes a group size parameter hardware module for matching a characteristic of the input digital data stream.

17. The system as claimed in claim 16 wherein the block size hardware for receiving the input digital data stream includes the block size hardware coupled to a digital video stream, an audio stream, or a combination thereof.

18. The system as claimed in claim 16 wherein the block size hardware is configured to generate a block boundary, and the block size hardware is coupled to the progressive-Golomb encoder.

19. The system as claimed in claim 16 further comprising a block reconstruction hardware module configured to assemble a delivered digital data stream from the progressive-Golomb codeword includes a progressive-Golomb decoder coupled to the block reconstruction module.

20. The system as claimed in claim 16 further comprising an output media coupled to the transmitter hardware includes a wired or wireless transmission channel, a compact disc, or a digital video disc.

* * * * *